(12) United States Patent
Takashige

(10) Patent No.: US 9,444,077 B2
(45) Date of Patent: Sep. 13, 2016

(54) LIGHT EMITTING ELEMENT MANUFACTURING METHOD, LIGHT EMITTING ELEMENT AND DISPLAY PANEL

(71) Applicant: JOLED INC., Tokyo (JP)

(72) Inventor: Yumeji Takashige, Osaka (JP)

(73) Assignee: JOLED INC., Tokyo (JP)

( * ) Notice: Subject to any disclaimer, the term of this patent is extended or adjusted under 35 U.S.C. 154(b) by 88 days.

(21) Appl. No.: 14/391,796

(22) PCT Filed: Jun. 13, 2013

(86) PCT No.: PCT/JP2013/003737
§ 371 (c)(1),
(2) Date: Oct. 10, 2014

(87) PCT Pub. No.: WO2013/187074
PCT Pub. Date: Dec. 19, 2013

(65) Prior Publication Data
US 2015/0069353 A1 Mar. 12, 2015

(30) Foreign Application Priority Data
Jun. 15, 2012 (JP) .................. 2012-135851

(51) Int. Cl.
*H01L 21/00* (2006.01)
*H01L 51/56* (2006.01)
(Continued)

(52) U.S. Cl.
CPC ........... *H01L 51/56* (2013.01); *H01L 27/3246* (2013.01); *H01L 51/0012* (2013.01); *H01L 51/5209* (2013.01); *H01L 51/5218* (2013.01); *H05B 33/10* (2013.01); *H05B 33/26* (2013.01)

(58) Field of Classification Search
CPC ... H01L 27/32; H01L 51/0008; H01L 51/00; H01L 27/326
USPC .......................................................... 438/46
See application file for complete search history.

(56) References Cited

U.S. PATENT DOCUMENTS 5,443,922 A 8/1995 Nishizaki et al.
8,778,712 B2 7/2014 Takeuchi
(Continued)

FOREIGN PATENT DOCUMENTS

JP 05-163488 6/1993
JP 2007-242592 9/2007
(Continued)

OTHER PUBLICATIONS

Interantional Search Report (ISR) from International Patent Application No. PCT/JP2013/003737, dated Sep. 17, 2013.

*Primary Examiner* — Samuel Gebremariam
(74) *Attorney, Agent, or Firm* — Greenblum & Bernstein, P.L.C.

(57) ABSTRACT

A method of manufacturing a light-emitting element. The method includes forming an underlayer that includes a reflective electrode, forming a bank that has liquid repellency, irradiating the bank with characteristic energy rays to decrease liquid repellency of the bank, and forming a functional layer. The bank is formed on the underlayer and is provided with an opening and an inclined portion surrounding the opening. The opening has a shape that has a long axis and a short axis and is positioned above the reflective electrode. In plan view, end sections of the inclined portion in a direction of the long axis overlap the upper surface of the reflective electrode, while central sections of the inclined portion in the direction of the long axis do not overlap the upper surface of the reflective electrode.

6 Claims, 14 Drawing Sheets

(51) Int. Cl.
*H05B 33/10* (2006.01)
*H05B 33/26* (2006.01)
*H01L 51/00* (2006.01)
*H01L 51/52* (2006.01)
*H01L 27/32* (2006.01)

(56) References Cited

U.S. PATENT DOCUMENTS

| | | |
|---|---|---|
| 8,921,867 B2 | 12/2014 | Okumoto et al. |
| 2007/0252525 A1 | 11/2007 | Seki |
| 2008/0303420 A1 | 12/2008 | Uchida |
| 2009/0026467 A1 | 1/2009 | Yanagihara |

FOREIGN PATENT DOCUMENTS

| | | |
|---|---|---|
| JP | 2008-234922 | 10/2008 |
| JP | 2009-026671 | 2/2009 |
| JP | 2010-153282 | 7/2010 |
| JP | 2011-096376 | 5/2011 |
| JP | 2011-249089 | 12/2011 |
| JP | 2012-022785 | 2/2012 |

LIGHT EMITTING ELEMENT MANUFACTURING METHOD, LIGHT EMITTING ELEMENT AND DISPLAY PANEL

TECHNICAL FIELD

The present invention relates to light-emitting element manufacturing methods, light-emitting elements, and display panels, and particularly to technology for forming functional layers of uniform film thickness by using coating methods.

BACKGROUND ART

Conventionally, in a light-emitting element manufacturing process, a functional layer such as a light-emitting layer, a hole transport layer, etc., is formed by application of ink containing functional material by a coating method such as an inkjet method. Inkjet methods include, for example, dropping ink into an opening provided in a bank, then forming a functional layer by drying the ink.

Film thickness of the functional layer is preferably uniform, and in a case where film thickness is not uniform, uneven luminance can occur. However, when the opening in the bank into which ink is dropped has a shape that has a long axis and a short axis, an effect occurs such that film thickness of a central portion of the functional layer in a direction of the long axis becomes thicker than film thickness of end portions of the functional layer in the direction of the long axis.

As one method of suppressing such an effect, making liquid repellency of surfaces of central sections in the direction of the long axis of an inclined portion of a bank greater than liquid repellency of surfaces of end sections in the direction of the long axis of the inclined portion of the bank is disclosed in patent literature 1. Specifically, a method is disclosed in which liquid repellency of a surface is reduced by irradiating with ultraviolet light only the end sections of the inclined portion, thereby making liquid repellency of the central sections of the inclined portion greater than the liquid repellency of the end sections.

CITATION LIST

Patent Literature

[Patent Literature 1]
Japanese Patent Application Publication No. 2009-26671

SUMMARY OF INVENTION

Technical Problem

However, in recent years pixels are being made smaller, and therefore exposing only the end sections of the inclined portion to ultraviolet light is difficult and impractical.

The present invention is achieved in view of the above technical problem, and aims to provide a method of manufacturing a light-emitting element in which a functional layer of uniform film thickness is formed without increasing manufacturing complexity. An additional aim of the present invention is to provide a light-emitting element and a display panel that can be easily manufactured even while ensuring that film thickness of a functional layer is uniform.

Solution to Problem

In order to achieve the above aims, one aspect of the present invention provides a method of manufacturing a light-emitting element, comprising: forming an underlayer on a substrate, the underlayer including a reflective electrode; forming, on the underlayer, a bank having liquid repellency and provided with an opening and an inclined portion surrounding the opening, the opening having a shape that has a long axis and a short axis and being positioned above the reflective electrode; radiating energy rays from above the bank towards the bank, the energy rays being transmitted through the bank, being reflected upwards at an upper surface of the reflective electrode, and causing the liquid repellency of the bank to decrease; and forming, on the underlayer, a functional layer within the opening, wherein, in forming the bank, in plan view, end sections of the inclined portion in a direction of the long axis overlap the upper surface of the reflective electrode, while central sections of the inclined portion in the direction of the long axis do not overlap the upper surface of the reflective electrode.

Advantageous Effects of Invention

In the light-emitting element manufacturing method pertaining to one aspect of the present invention, in plan view, the end sections of the inclined portion in the direction of the long axis overlap the upper surface of the reflective electrode, while the central sections of the inclined portion in the direction of the long axis do not overlap the upper surface of the reflective electrode. At the end sections of the inclined portion, the energy rays radiated from above and transmitted through the inclined portion are reflected upwards at the upper surface of the reflective electrode, and are therefore transmitted twice through the inclined portion. In contrast, at the central sections of the inclined portion, the energy rays radiated from above and transmitted through the inclined portion are not reflected upwards at the upper surface of the reflective electrode, and are therefore transmitted only once through the inclined portion. Thus, an irradiation amount due to energy rays incident on the central sections of the inclined portion is less than an irradiation amount due to energy rays incident on the end sections of the inclined portion. As a result, film thickness of the functional layer is uniform, because liquid repellency of the surfaces of the central sections of the inclined portion is greater than liquid repellency of the surfaces of the end sections of the inclined portion. Because such a structure is possible to implement simply by appropriately adjusting the position of the opening relative to the reflective electrode and shape, etc., of the opening, the structure does not require addition of a new process or increased process complexity. Accordingly, complexity of the method of manufacturing the light-emitting element is not increased.

DESCRIPTION OF EMBODIMENTS

Figure 1:
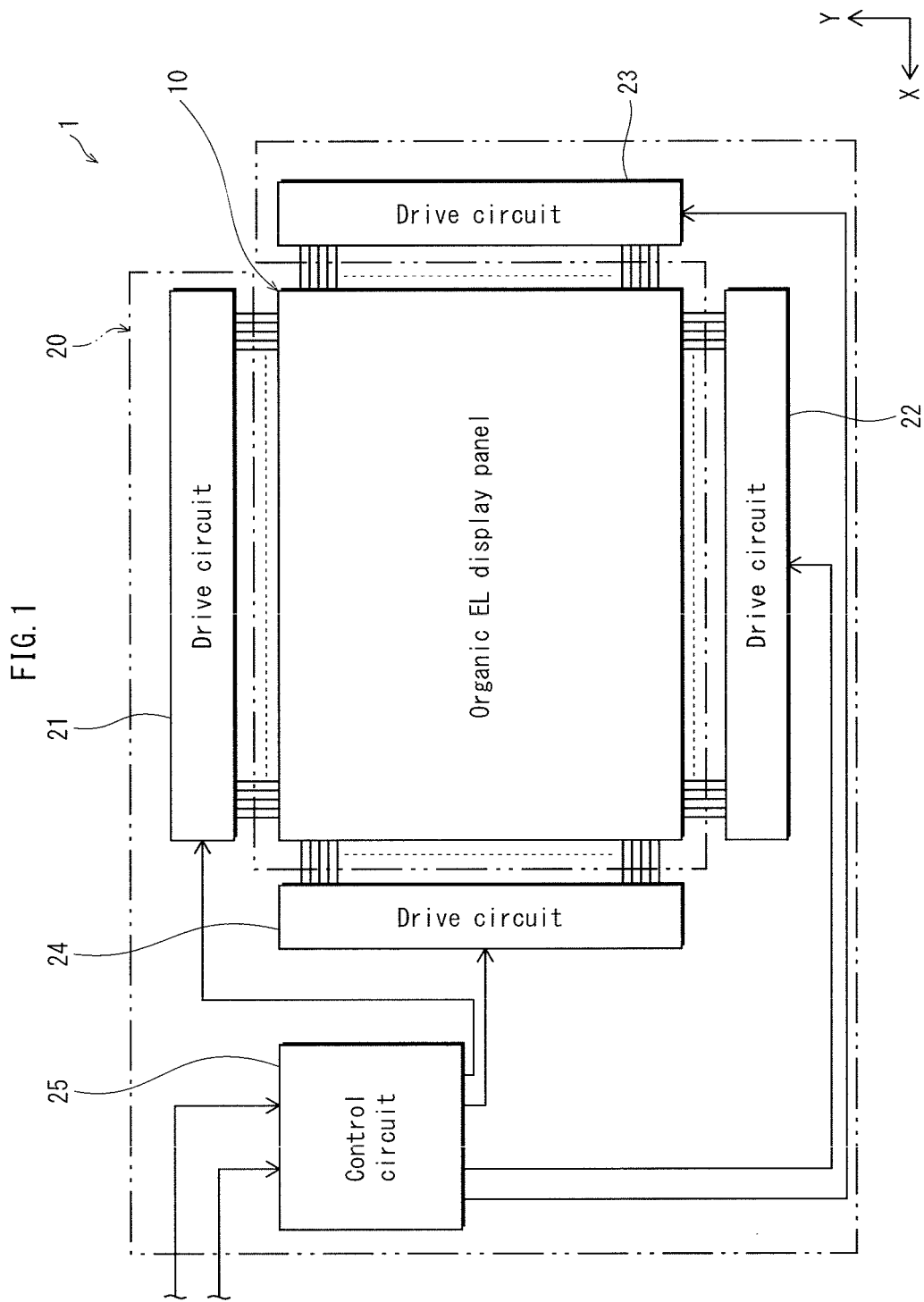
FIG. 1 is a diagram illustrating an overall structure of a display device including a display panel pertaining to embodiment 1.

In the following, a manufacturing method of a light-emitting element, a light element, and a display panel are described with reference to the drawings.

[Outline of Aspects of Present Invention]

One aspect of the present invention provides a method of manufacturing a light-emitting element, comprising: forming an underlayer on a substrate, the underlayer including a reflective electrode; forming, on the underlayer, a bank having liquid repellency and provided with an opening and an inclined portion surrounding the opening, the opening having a shape that has a long axis and a short axis and being positioned above the reflective electrode; radiating energy rays from above the bank towards the bank, the energy rays being transmitted through the bank, being reflected upwards at an upper surface of the reflective electrode, and causing the liquid repellency of the bank to decrease; and forming, on the underlayer, a functional layer within the opening, wherein, in forming the bank in plan view, end sections of the inclined portion in a direction of the long axis overlap the upper surface of the reflective electrode, while central sections of the inclined portion in the direction of the long axis do not overlap the upper surface of the reflective electrode.

Further, in the method pertaining to one aspect of the present invention, in forming the underlayer, a side surface of the reflective electrode, contiguous with the upper surface of the reflective electrode, may be formed to be an inclined surface, and in forming the bank, the central sections of the inclined portion may be formed so as to overlap, in plan view, the side surface of the reflective electrode.

Further, in the method pertaining to one aspect of the present invention, in forming the underlayer, the side surface of the reflective electrode may be formed to have an angle of inclination with respect to an upper surface of the substrate no less than 20° and no greater than 70°.

Further, in the method pertaining to one aspect of the present invention, in forming the bank, the central sections of the inclined portion may be formed so as not to overlap, in plan view, the upper surface or a side surface of the reflective electrode, the side surface of the reflective electrode being contiguous with the upper surface of the reflective electrode.

Further, in the method pertaining to one aspect of the present invention, in forming the underlayer, the side surface of the reflective electrode may be foi Hied to be substantially perpendicular with respect to an upper surface of the substrate.

Further, in the method pertaining to one aspect of the present invention, in forming the underlayer, a light-transmissive electrode may be formed to be located below the opening so as to entirely overlap, in plan view, a lowest end of the shape of the opening.

A light-emitting element pertaining to one aspect of the present invention comprises: a substrate; an underlayer on the substrate, the underlayer including a reflective electrode; a bank having liquid repellency and provided with an opening and an inclined portion surrounding the opening, the opening having a shape that has a long axis and a short axis and being positioned above the reflective electrode; and a functional layer on the underlayer, within the opening, wherein, in plan view, end sections of the inclined portion in a direction of the long axis overlap the upper surface of the reflective electrode, while central sections of the inclined portion in the direction of the long axis do not overlap the upper surface of the reflective electrode.

Further, in the light-emitting element pertaining to one aspect of the present invention, a side surface of the reflective electrode, contiguous with the upper surface of the reflective electrode, may be an inclined surface, and the central sections of the inclined portion may overlap, in plan view, the side surface of the reflective electrode.

Further, in the light-emitting element pertaining to one aspect of the present invention, the central sections of the inclined portion may be configured so as to not overlap, in plan view, the reflective electrode.

A display panel pertaining to one aspect of the present invention includes a plurality of any one of the light-emitting elements described above.

[Background of Present Invention]

As a method of controlling the effect of film thickness of the central portion in the direction of the long axis of the functional layer becoming thicker than film thickness of the end portions in the direction of the long axis of the functional layer, ensuring that liquid repellency of the surfaces of the central sections in the direction of the long axis of the inclined portion of a bank is higher than liquid repellency of the surface of the end sections in the direction of the long axis of the inclined portion of the bank is effective, as mentioned above. As a method of forming such a bank, reducing liquid repellency of a surface by irradiating with ultraviolet light only the end sections of the inclined portion may be considered. However, in recent years pixels are being made smaller, and therefore exposing only the end sections of the inclined portion to ultraviolet light is difficult and impractical, as mentioned above. As an alternative method, for example, forming the end sections of the inclined portion from material having low liquid repellency and forming the central sections of the inclined portion from material having high liquid repellency may be considered. However, because forming the bank using two types of material that have different liquid repellency is complex, the manufacturing method of the light-emitting element also becomes complex.

Thus, the inventors investigated various methods with an aim of easily forming the bank. As a result, the inventors arrived at an idea that controlling liquid repellency of the bank by using the reflective electrode would be effective. In other words, the inventors realized that liquid repellency of a surface of the bank may be controlled by adjusting an amount of irradiation of the bank by the energy rays, and the amount of irradiation may be adjusted by using reflection of the energy rays at the upper surface of the reflective electrode. Thus, the inventors realized that reflection of the energy rays could be achieved by appropriately adjusting the position of the opening relative to the reflective electrode and the shape, etc., of the opening.

When the energy rays are radiated from above the bank downward towards the bank, the energy rays are transmitted through the bank, etc. However, when the upper surface of the reflective electrode is present below the bank, the energy rays are reflected upwards due to the upper surface of the reflective electrode. In other words, when the upper surface of the reflective electrode is present below a segment of the bank, the energy rays are transmitted through the segment from above to below, then again transmitted through the segment from below to above after being reflected upwards at the reflective electrode. Thus, the energy rays are transmitted twice through the segment. On the other hand, when the upper surface of the reflective electrode is not present below a segment of the bank, the energy rays are only transmitted through the segment from above to below. Thus, the energy rays are only transmitted once through the segment.

When the bank is formed such that, in plan view, the end sections of the inclined portion overlap the upper surface of the reflective electrode and the central sections of the inclined portion do not overlap the upper surface of the reflective electrode, even if the energy rays are radiated from above the bank uniformly with respect to the entire bank, the energy rays are transmitted twice through the end sections and only once through the central sections. Thus, an amount of irradiation of the central sections by the energy rays is less than an amount of irradiation of the end sections by the energy rays, and as a result, liquid repellency of the surfaces of the central sections becomes greater than liquid repellency of the surfaces of the end sections.

In this way, making liquid repellency of the surfaces of the central sections greater than liquid repellency of the surfaces of the end sections is possible to achieve simply by appropriately adjusting the position of the opening relative to the reflective electrode and shape, etc., of the opening, and therefore additional new processes are not required and complexity of existing processes is not increased.

<Embodiment 1>
(Schematic Structure of the Light-Emitting Element and Display Panel)

Figure 2:
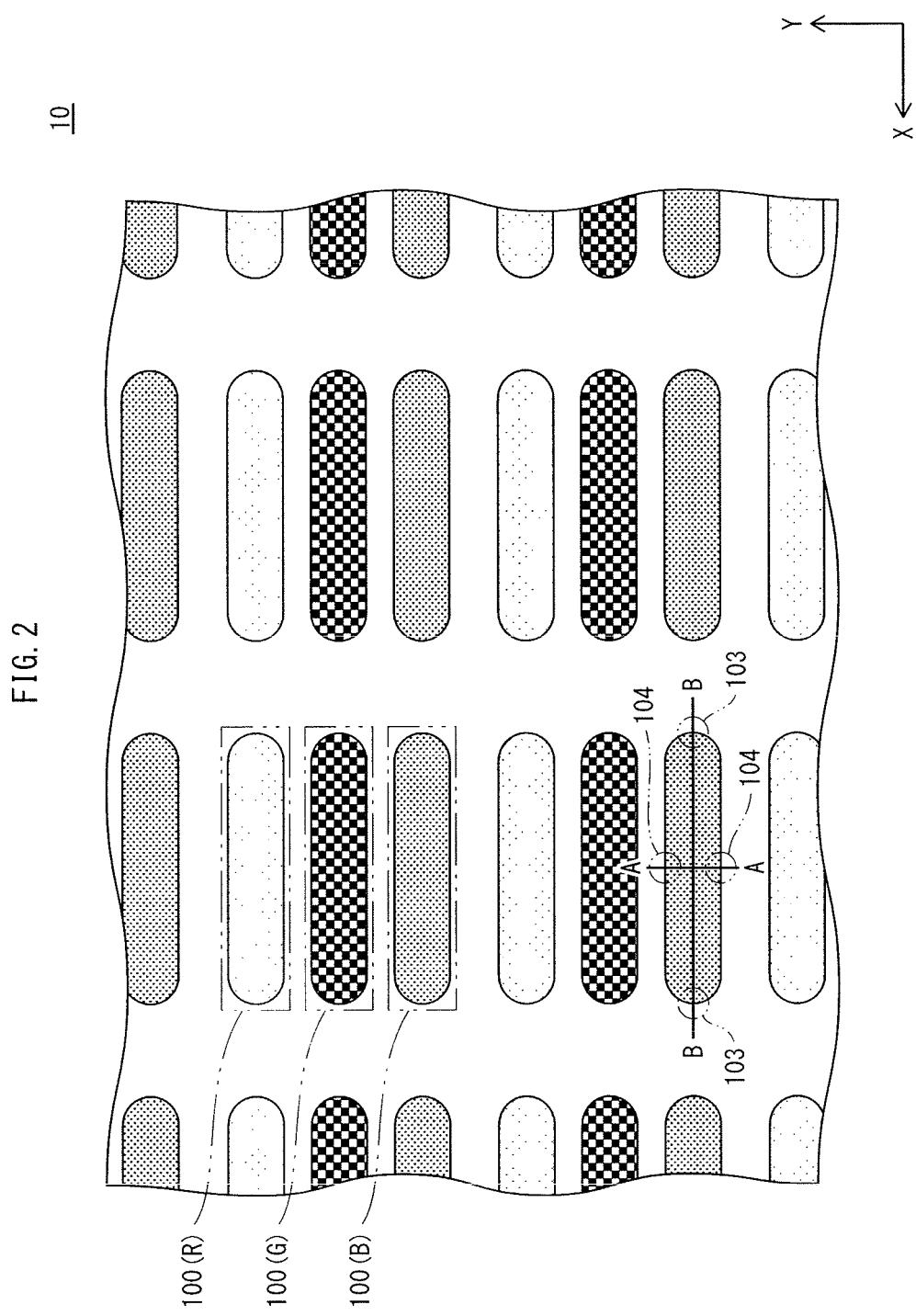
FIG. 2 is a plan view illustrating a portion of a surface of the display panel pertaining to embodiment 1.

FIG. 1 is a diagram illustrating an overall structure of a display device including a display panel pertaining to embodiment 1. FIG. 2 is a plan view illustrating a portion of a surface of the display panel pertaining to embodiment 1.

A display device 1 illustrated in FIG. 1 is an organic EL display device used in a display, television, mobile telephone, etc., and includes a display panel 10, pertaining to embodiment 1, and a drive control section 20 connected to the display panel 10. The drive control section 20 includes four drive circuits 21-24 and a control circuit 25.

As illustrated in FIG. 2, the display panel 10 includes a plurality of light-emitting elements 100, each of which pertains to an aspect of the present invention. Each light-emitting element 100 is a sub-pixel that is red (R), green (G), or blue (B), and a pixel is composed of a set of one of each color (R, G, and B) of sub-pixel.

Figure 3A:
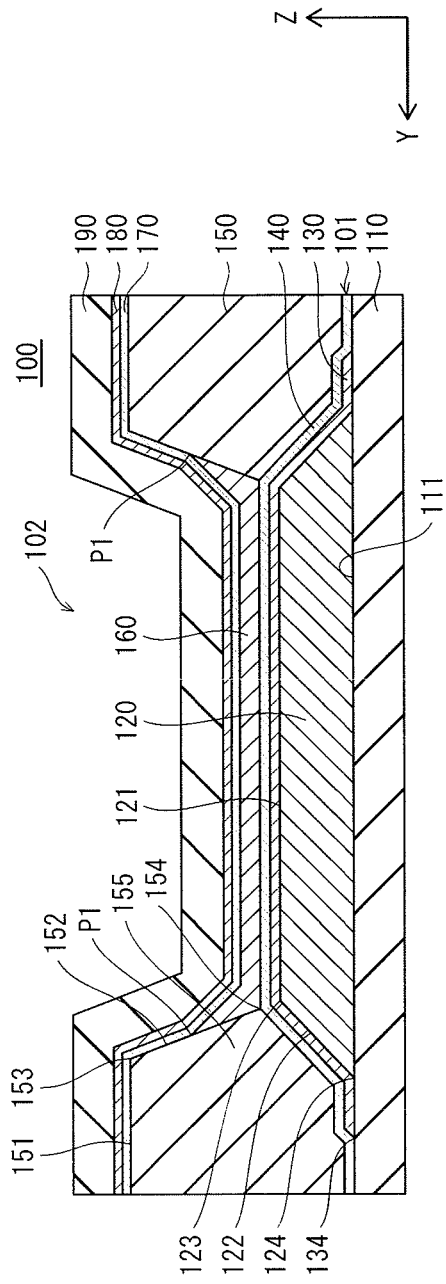
FIG. 3A and FIG. 3B are end views illustrating a light-emitting element pertaining to embodiment 1.
Figure 3B:
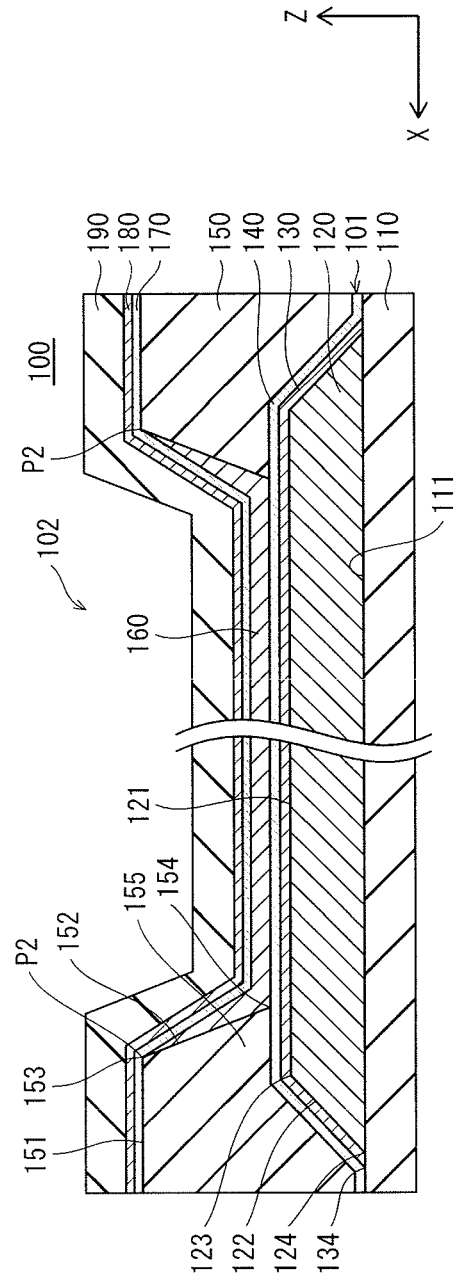

FIG. 3A and FIG. 3B are end views illustrating a light-emitting element pertaining to embodiment 1. FIG. 3A is an end view of a cross-section taken along an A-A line in FIG. 2. FIG. 3B is an end view of a cross-section taken along a B-B line in FIG. 2. Note that in this specification, a direction along the A-A line is the direction of the short axis and a direction along the B-B line is the direction of the long axis.

As illustrated in FIGS. 3A and 3B, the light-emitting element 100 is a top-emission organic EL element in which a reflective electrode 120, a light-transmissive electrode 130, a hole-injection layer 140, a bank 150, a light-emitting layer 160 as the functional layer, an electron injection layer 170, a shared electrode 180, and a sealing layer 190 are layered above a TFT substrate 110 (hereafter, "substrate 110"). In this embodiment, an underlayer 101 is composed of the reflective electrode 120, the light-transmissive electrode 130, and the hole-injection layer 140.

Note that in the light-emitting element 100, other layers such as a hole transport layer, electron-transport layer, etc., may be included. Further, the functional layer pertaining to an aspect of the present invention is not limited to being the light-emitting layer 160, and may be a hole transport layer, buffer layer, etc., that can be formed by a coating method.

Above the substrate 110, the reflective electrode 120 is provided in a plurality arranged in a matrix, the light-transmissive electrode 130 is provided in a plurality, and above each reflective electrode 120 is a corresponding light-transmissive electrode 130. The hole-injection layer 140 covers all of the plurality of light-transmissive electrodes 130. Above the hole-injection layer 140 is the bank 150, in which an opening 102 is provided to define a sub-pixel. Within the opening 102 is the light-emitting layer 160. Further, above the light-emitting layer 160, the electron injection layer 170, the shared electrode 180, and the sealing layer 190 are layered in the stated order, not only within the opening 102 but also over the bank 150. Note that in this embodiment, the hole-injection layer 140 is below the bank 105. However, for example, the hole-injection layer 140 may be within the opening 102 of the bank 150, the same way at the light-emitting layer 160, and formed by a coating method.

The substrate 110 is formed from an insulating material such as soda glass, non-fluorescent glass, phosphate glass, borate glass, silica glass, acrylic resin, styrene resin, polycarbonate resin, epoxy resin, polyethylene, polyester, silicone resin, alumina, etc.

Each reflective electrode 120 is formed from, for example, aluminium (Al), silver (Ag), an alloy of silver, palladium, and copper (APC), an alloy of silver, rubidium, and gold (ARA), an alloy of molybdenum and chromium (MoCr), or an alloy of nickel and chromium (NiCr). The reflective electrode 120 does not only function as an anode, but also has a function of reflecting and guiding upwards visible light generated by at the light-emitting layer 160.

Each light-transmissive electrode 130 is formed from, for example, indium tin oxide (ITO) or indium zinc oxide (IZO). The light-transmissive electrode 130 is interposed between the reflective electrode 120 and the hole-injection layer 140 and does not only function as an anode, but also has a function of improving a bonding property between the reflective electrode 120 and the hole-injection layer 140.

The hole-injection layer 140 is formed from a metal compound such as, for example, a metal oxide, a metal nitride, or a metal oxynitride. As a metal compound, for example, chromium (Cr), molybdenum (Mo), tungsten (W), vanadium (V), niobium (Nb), tantalum (Ta), titanium (Ti), zirconium (Zr), hafnium (Hf), scandium (Sc), yttrium (Y), thorium (Th), manganese (Mn), iron (Fe), ruthenium (Ru), osmium (Os), cobalt (Co), nickel (Ni), copper (Cu), zinc (Zn), cadmium (Cd), aluminium (Al), gallium (Ga), indium (In), silicon (Si), germanium (Ge), tin (Sn), lead (Pb), antimony (Sb), bismuth (Bi), or any rare earth element from lanthanum (La) to lutetium (Lu) may be used.

The bank 150 is formed from, for example, an organic material such as resin, etc., or an inorganic material such as glass, etc. Examples of organic material include acrylic resin, polyimide resin, Novalac-type phenolic resin, etc., while examples of inorganic resin include silicon oxide ($SiO_2$), silicon nitride ($Si_3N_4$), etc. As illustrated in FIG. 2, each of the openings 102 is provided in the bank 150 at a position corresponding to a respective one of the reflective electrodes 120, or in other words at a position corresponding to a sub-pixel. Each of the openings 102 has, in plan view, a shape having a long axis and a short axis. Specifically, the opening 102 has a long hole shape such that two sides either side of the long axis are straight, and two sides either side of the short axis are semicircular arcs.

Returning to FIGS. 3A and 3B, the light-emitting layer 160 is formed from, for example, poly(9,9-di-n-octylfluorene-alt-benzothiadiazole) (F8BT), which is an organic polymer. Note that the light-emitting layer 160 is not limited a structure composed of this material, and may be a structure including conventional organic materials. For example, fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of an 8-hydroxyquinoline compound, metal complex of a 2-bipyridine compound, complex of a Schiff base and a group three metal, metal complex of oxine, rare earth metal complex, etc., as recited in Japanese Patent Application Publication No. H5-163488.

The electron injection layer 170 has a function of transporting electrons injected from the shared electrode 180 to the light-emitting layer 160, and is formed from, for example, barium, phthalocyanine, lithium fluoride, or a mixture thereof.

The shared electrode 180 is formed from, for example, ITO or IZO, and has a function as a cathode.

The sealing layer 190 has a function of restricting exposure of the light-emitting layer 160 to moisture, air, etc., and is formed from, for example, a material such as silicon nitride (SiN) or silicon oxynitride (SiON).

(Main Structure of Light-Emitting Element)

Figure 4A:
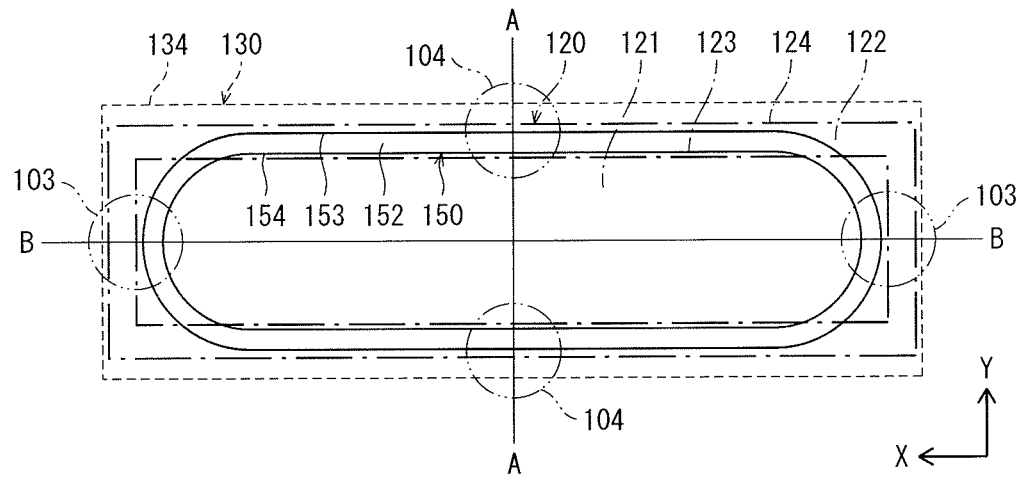
FIGS. 4A to 4C are schematic diagrams illustrating a reflective electrode, light-transmissive electrode, and bank of the light-emitting element pertaining to embodiment 1.
Figure 4B:
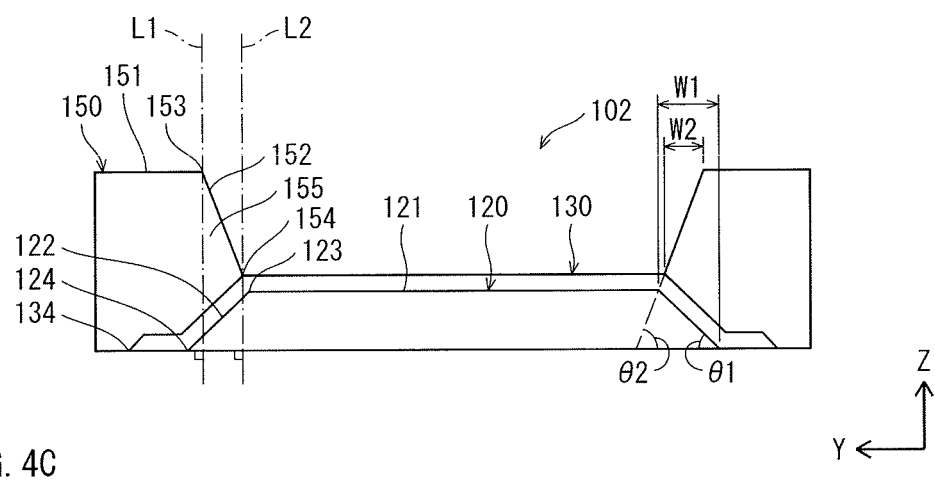
Figure 4C:
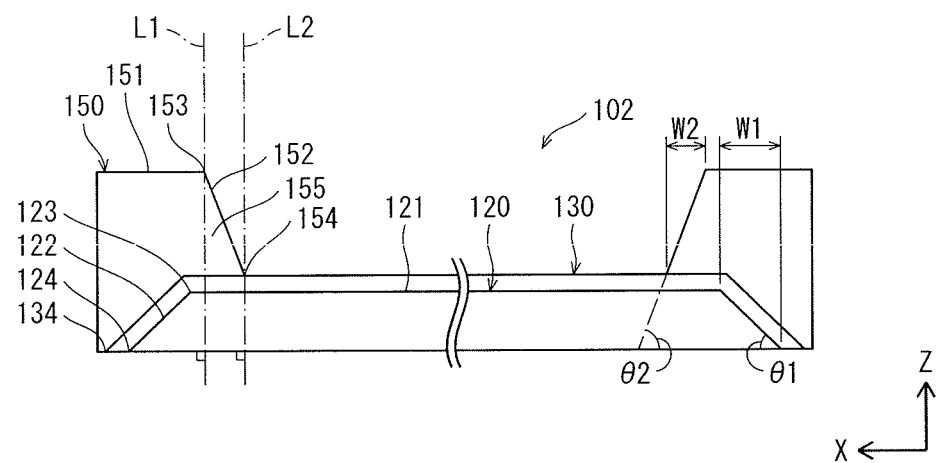

Next, the main structure of the light-emitting element is described. FIGS. 4A-4C are schematic views of the reflective electrode, light-transmissive electrode, and bank of the light-emitting element pertaining to embodiment 1. FIG. 4A is a plan view, FIG. 4B is an end view of a portion along the line A-A in FIG. 2, and FIG. 4C is an end view of a portion along the line B-B in FIG. 2. Note that in FIGS. 4A-4C, layers other than the reflective electrode, light-transmissive electrode, and bank are omitted.

As illustrated in FIGS. 4A-4C, the reflective electrode 120 has an upper surface 121 that is parallel to an upper surface 111 of the substrate 110 and a side surface 122 that is inclined with respect to the upper surface 111 of the substrate 110. The side surface 122 has an upper edge 123 that is contiguous with the upper surface 121, and a lower edge 124 that is in contact with the upper surface 111 of the substrate 110.

The reflective electrode reflects the energy rays at the surfaces thereof (the upper surface 121 and the side surface 122). In order that the energy rays are efficiently reflected at the surface of the reflective electrode 120, the reflective electrode 120 is preferably formed from a metal or other material that has a reflectivity of 50% to 90% with respect to light of wavelengths 245 nm to 365 nm, such as Al, rhodium (Rh), etc. For example, if the reflective electrode 120 is formed from Al, a reflectivity of about 90% can be expected.

The light-transmissive electrode 130 is formed so as to, in plan view, cover the entirety of the reflective electrode 120 and close the entirety of a lowest end of the opening 102. Because the light-transmissive electrode 130 is formed in the entirety of a region corresponding to the opening 102, holes can be injected across the entire region within the hole 102, regardless of whether the reflective electrode 120 is present.

The bank 150 has an upper surface 151 that is parallel with the upper surface 111 of the substrate 110 and an inclined surface 152 that is inclined with respect to the upper surface 111 of the substrate 110. The inclined surface 152 has an annular shape facing the opening 102. An upper edge 153 of the inclined surface 152 is contiguous with the upper surface 151, and a lower edge 154 is in contact with the hole-injection layer 140.

The bank 150 has an inclined portion 155 surrounding the opening 102. The inclined portion 155 is, in a cross-section perpendicular to the upper surface 111 of the substrate 110 (see FIG. 4B and FIG. 4C), a portion between a boundary L1, which is perpendicular to the upper surface 111 of the substrate 110 and passes through the upper edge 153 of the inclined surface 152, and a boundary L2, which is perpendicular to the upper surface 111 of the substrate 110 and passes through the lower edge 154 of the inclined surface 152. In plan view (see FIG. 4A), the end sections (portions indicated by signs 103 in FIG. 2) in the direction of the long axis of the inclined portion 155 of the bank 150 overlap the upper surface 121 of the reflective electrode 120, and the central sections (portions indicated by signs 104 in FIG. 2) in the direction of the long axis of the inclined portion 155 of the bank 150 do not overlap the upper surface 121 of the reflective electrode 120.

Surfaces (the upper surface 151 and the inclined surface 152) of the bank 150 have liquid repellency. Liquid repellency of the surfaces of the bank 150 is due to applying a liquid-repellant treatment to the surfaces, or due to the bank 150 being formed from liquid-repellant material.

Figure 5A:
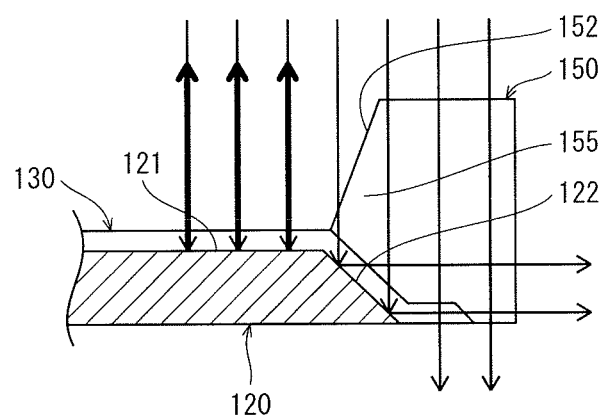
FIGS. 5A and 5B are schematic diagrams illustrating reflection of energy rays at the light-emitting element pertaining to embodiment 1.
Figure 5B:
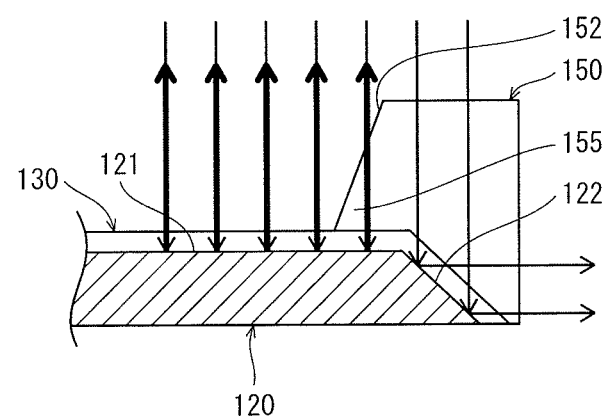

FIGS. 5A and 5B are schematic diagrams illustrating reflection of the energy rays at the light-emitting element pertaining to embodiment 1. FIG. 5A illustrates reflection at the central sections of the inclined portion. FIG. 5B illustrates reflection at the end sections of the inclined portion.

Note that in FIG. 5A and FIG. 5B, layers other than the reflective electrode, light-transmissive electrode, and bank are omitted.

As illustrated in FIG. 5A and FIG. 5B, because the upper surface 121 of the reflective electrode 120 is parallel to the upper surface 111 of the substrate 110, energy rays radiated from directly above the upper surface 121 of the reflective electrode 120 are transmitted through the bank 150, the light-transmissive electrode 130, etc., are incident on the upper surface 121 of the reflective electrode 120, and are reflected directly upwards. On the other hand, because the side surface 122 is inclined with respect to the upper surface 111 of the substrate 110, energy rays radiated from directly above the side surface 122 of the reflective electrode 120 are transmitted through the bank 150, the light-transmissive electrode 130, etc., are incident on the side surface 122, and are reflected sideways due to the side surface 122.

An incline angle θ1 (see FIGS. 4A and 4B) between the upper surface 111 of the substrate 110 and the side surface 122 of the reflective electrode 120 is preferably at least 20°. When the incline angle θ1 is at least 20°, it is difficult for energy rays reflected at the side surface 122 to be transmitted through the inclined surface 152. Further, when the incline angle θ1 is at least 30°, most energy rays reflected at the side surface 122 are not transmitted through the inclined surface 152, and such an angle is preferable for this reason. For example, when the incline angle θ1 is 45°, energy rays radiated from directly above the reflective electrode 120 that are incident on the side surface 122 are reflected in a direction parallel to the upper surface 111 of the substrate 110, i.e. at a right angle. Further, the incline angle θ1 is preferably at most 70°. If the incline angle θ1 is greater than 70°, there is a risk of the light-transmissive electrode 130, which is formed on the reflective electrode 120, being cut by the upper edge 123 of the side surface 122.

Note that an incline angle θ2 between the inclined surface 152 of the bank 150 and the upper surface 111 of the substrate 110 is preferably at least 40°, such that it is difficult for energy rays reflected at the side surface 122 of the reflective electrode 120 to be transmitted through the inclined surface 152 of the bank 150. Further, the incline angle θ2 is preferably at most 60°, so that a function of containing ink within the opening 102 is sufficiently exhibited.

In order that, in plan view, the entirety of the central sections 104 of the inclined portion 155 overlap the side surface 122 of the reflective electrode 120, in a cross-section perpendicular to the upper surface 111 of the substrate 110 (see FIG. 4B and FIG. 4C), in a direction parallel to the upper surface 111, a width W1 of the side surface 122 of the reflective electrode 120 is wider than a width W2 of the inclined surface 152 of the bank 150. In plan view, as long as the central sections 104 of the inclined portion 155 overlap at least slightly with the side surface 122 of the reflective electrode 120, an amount of energy rays reflected by the upper surface 121 of the reflective electrode 120 towards the inclined portion 155 is reduced. However, in terms of not reducing liquid repellency of the inclined surface 152 of the bank 150, a complete overlap of the inclined portion 155 with the side surface 122 is preferable.

Reflection of the energy rays differs at the end sections 103 of the inclined portion 155 and the central sections 104 of the inclined portion 155.

As illustrated in FIG. 5A, at the central sections 104 of the inclined portion 155, the side surface 122 of the reflective electrode 120 is present at a position corresponding to the inclined portion 155 (directly below the inclined portion 155), and therefore energy rays transmitted through the inclined portion 155 that reach the reflective electrode 120 are reflected sideways. Accordingly, although reflected energy rays are transmitted through a small lower end portion of the inclined portion 155, the inclined surface 152 of the bank 150 is passed through only once.

On the other hand, as illustrated in FIG. 5B, at the end sections 103 of the inclined portion 155, the upper surface 121 of the reflective electrode 120 is present at a position corresponding to the inclined portion 155, and therefore energy rays transmitted through the inclined portion 155 that reach the reflective electrode 120 are reflected upwards. Accordingly, reflected energy rays are again transmitted through the entirety of the inclined portion 155. In such a case, the energy rays pass through the inclined surface 152 of the bank 150 twice.

In this way, an irradiation amount due to energy rays incident on the inclined surface 152 and the inclined portion 155 differs between the end sections 103 of the inclined portion 155 and the central sections 104 of the inclined portion 155. The end sections 103 of the inclined portion 155 are irradiated by a greater amount of energy rays. Accordingly, the inclined surface 152 has a higher liquid repellency at the central sections 104 than at the end sections 103.

As illustrated in FIG. 3A and FIG. 3B, a pinning point P1 of the light-emitting layer 160 is low at the central sections 104, where liquid repellency of the inclined surface 152 is low, and a pinning point P2 of the light-emitting layer 160 is high at the end sections 103, where liquid repellency of the inclined surface 152 is high. As a result, film thickness of the light-emitting layer 160 at the end sections 103 approximates film thickness of the light-emitting layer 160 at the central sections 104.

<Method of Manufacturing the Light-Emitting Element>

FIGS. 6A to 6D are process diagrams for describing a main part of a method of manufacturing the light-emitting element pertaining to embodiment 1. In FIGS. 6A to 6D, images on the left side illustrate an end view of a central portion of the light-emitting element and images on the right side illustrate an end view of end portions of the light-emitting element.

Figure 6A:
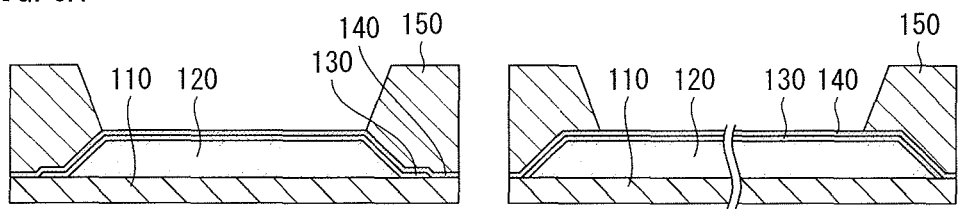
FIGS. 6A to 6D are process diagrams for describing a main part of a method of manufacturing the light-emitting element pertaining to embodiment 1.

In the light-emitting element manufacturing method pertaining to one aspect of the present invention, first, as illustrated in FIG. 6A, the reflective electrode 120, the light-transmissive electrode 130, and the hole-injection layer 140 are formed on the substrate 110 as the underlayer 101 (underlayer forming process), then the bank 150 is formed on the underlayer 101 (bank forming process).

The reflective electrode 120 is formed by patterning via photolithography, for example, of a metal thin film formed by sputtering, for example. Note that the metal thin film may even be formed by vacuum deposition, etc. The light-transmissive electrode 130 is formed by patterning via photolithography, for example, of an ITO thin film formed by sputtering, for example. The hole-injection layer 140 is formed from a WOx film having uniform film thickness across the entirety of the upper surface of the substrate 110, via a vacuum deposition method or sputtering method, for example.

The bank 150 is formed by, for example, forming a resist layer (for example a resin layer) that includes a photoresist material by coating, etc., on the hole-injection layer 140, exposing the resist layer to light through a mask, and removing the desired portion of the resist layer by developing with a developer to provide the opening 102. The opening 102 is provided such that, in plan view, the end sections 103 of the inclined portion 155 overlap the upper surface 121 of the reflective electrode 120 and the central sections 104 of the inclined portion 155 do not overlap the upper surface 121 of the reflective electrode 120.

Figure 6B:
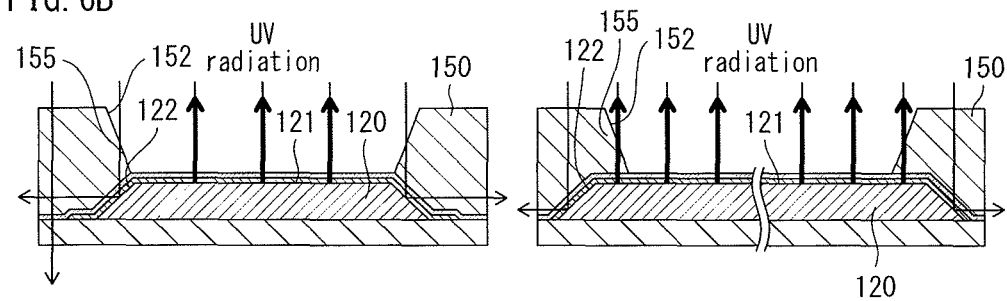

Next, as illustrated in FIG. 6B, energy rays are radiated from above the bank 150 towards the bank 150, uniformly irradiating the entirety of the bank 150 (energy ray radiating process). Here, ultraviolet light, for example, may be used as the energy rays. As a wavelength of ultraviolet light, 254 nm, 365 nm, etc., may be used, for example. Aside from ultraviolet light, soft X-rays, for example, may be used as the energy rays. Note that the energy rays are preferably transmitted through the substrate 110, the light-transmissive electrode 130, the hole-injection layer 140, and the bank 150.

In a region where the upper surface 121 of the reflective electrode 120 is present, the energy rays are reflected upwards due to the upper surface 121. Thus, the energy rays pass twice through the inclined portion 155 of the bank 150 that is positioned above the reflective electrode 120, and due to the abundant energy of the energy rays, a liquid-repellant component of the inclined surface 152 of the inclined portion 155 is efficiently decomposed and eliminated. Due to the energy ray radiating process, liquid repellency of the inclined surface 152 at the central sections 104 of the inclined portion 155 is greater than liquid repellency of the inclined surface 152 at the end sections 103 of the inclined portion 155.

Note that in radiating the energy rays in the presence of ozone ($O_3$), ozone molecules cause occurrence of active oxygen, thereby decomposing and eliminating minute residue present in surfaces of the bank 150. Here, when reducing liquid repellency of a surface of the bank 150, also decomposing and eliminating residue of said surface is efficient.

Figure 6C:
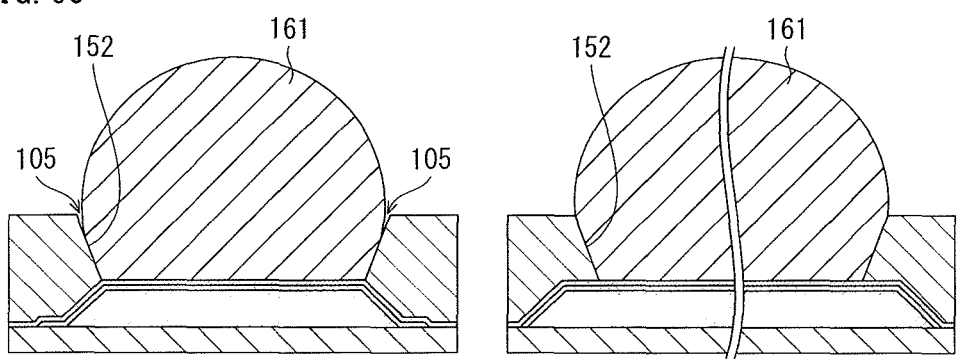
Figure 6D:
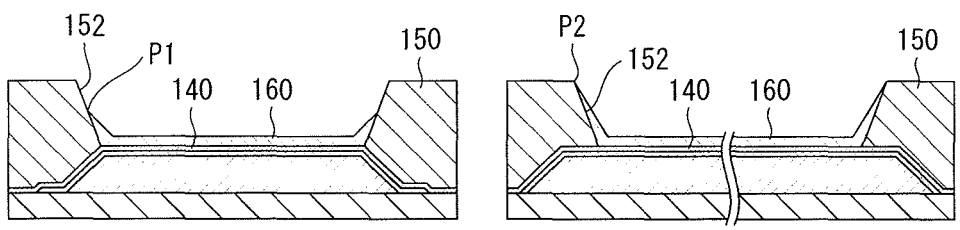

Next, as illustrated in FIG. 6C and FIG. 6D, the light-emitting layer 160 is formed within the opening 102 (functional layer forming process). First, as illustrated in FIG. 6C, by dropping ink 161 within the opening 102 by, for example, an inkjet method, the ink 161 is coated within the opening 102. Note that the ink 161 may be coated by coating methods such as a dispenser method, nozzle coating method, spin coating method, intaglio printing, relief printing, etc.

In the central sections 104 of the inclined portion 155, liquid repellency of the inclined surface 152 is high, and therefore not-wet regions 105 occur easily, which are not coated by an ink. On the other hand, in the end sections 103 of the inclined portion 155, liquid repellency of the inclined surface 152 is low, and therefore the not-wet regions 105 do not occur easily.

Next, as illustrated in FIG. 6D, the ink 161 is dried, forming the light-emitting layer 160. When forming the light-emitting layer 160, at the central sections 104 where liquid repellency of the inclined surface 152 is high, the pinning point P1 becomes low, and at the end sections 103 where liquid repellency of the inclined surface 152 is low, the pinning point P2 becomes high. As a pinning point becomes lower, an amount of functional material attaching to the inclined surface 152 decreases, and therefore when considering only an effect of the pinning point, film thickness of the central sections 104 of the light-emitting layer 160 tends to become thinner than film thickness of the end sections 103 of the light-emitting layer 160.

However, essentially, wettability of the inclined surface 152 at the central sections 104 is higher than wettability of the inclined surface 152 at the end sections 103, and therefore functional material may more easily attach to the inclined surface 152 of the central sections 104. Thus, if pinning points are at the same height, film thickness of the central sections 104 of the light-emitting layer 160 becomes thicker than film thickness of the end portions 103 of the light-emitting layer 160. However, as mentioned above, because the pinning point at the central sections 104 is low, an effect of wettability upon film thickness of the light-emitting layer 160 and an effect of the pinning point upon film thickness of the light-emitting layer 160 cancel out, and therefore film thickness of the central sections 104 of the light-emitting layer 160 approximates film thickness of the end sections 103 of the light-emitting layer 160.

After forming the light-emitting layer 160, a barium thin film that becomes the electron injection layer 170 is formed by vacuum deposition, for example. Afterward, an ITO thin film that becomes the shared electrode 180 is formed by sputtering, for example. Finally, the sealing layer 190 is formed, completing the light-emitting element 100. Further, by forming a plurality of light-emitting elements 100 by the above-described processes, the display panel 10 may be completed.

In the above-described method for manufacturing a light-emitting element pertaining to one aspect of the present invention, in a plan view, the central sections 104 of the inclined portion 155 are formed so as to not overlap the side surface of the reflective electrode 120, and therefore the light-emitting layer 160 has a uniform film thickness.

On the other hand, by conventional manufacturing methods, in plan view, the central sections of the inclined portion overlap the upper surface of the reflective electrode, and therefore achieving uniform film thickness of the light-emitting layer is difficult. The reason for this is described below.

FIGS. 7A to 7D are process diagrams for describing a main part of a method of manufacturing a light-emitting element pertaining to a comparative example 1. In FIGS. 7A to 7D, images on the left side illustrate an end view of a central portion of the light-emitting element and images on the right side illustrate an end view of end portions of the light-emitting element.

Figure 7A:
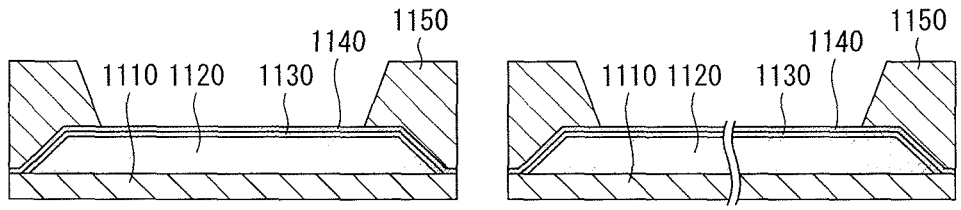
FIGS. 7A to 7D are process diagrams for describing a main part of a method of manufacturing a light-emitting element pertaining to a comparative example 1.
Figure 7B:
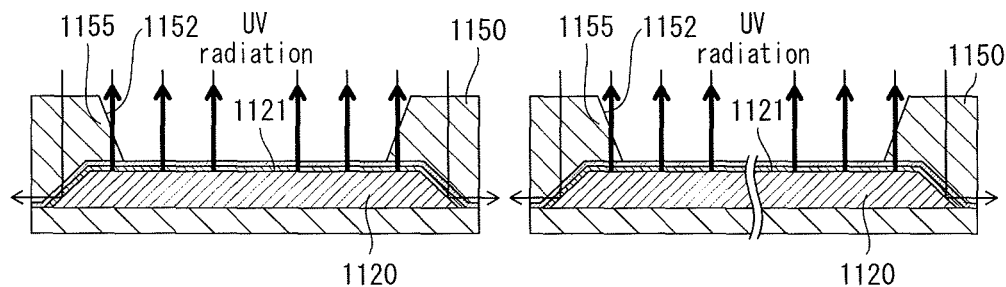
Figure 7C:
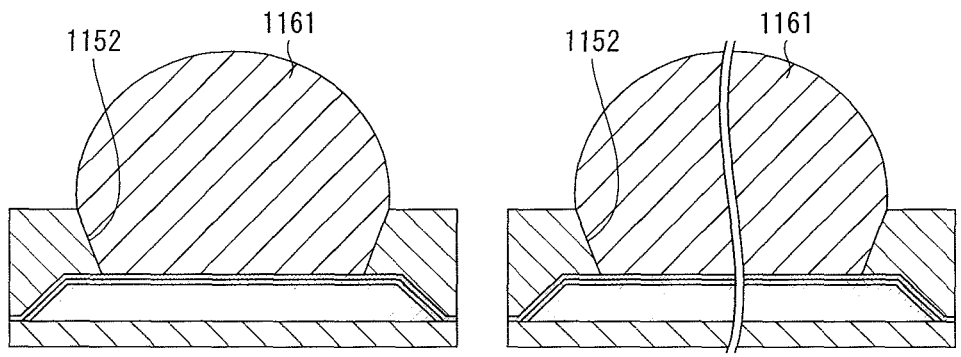
Figure 7D:
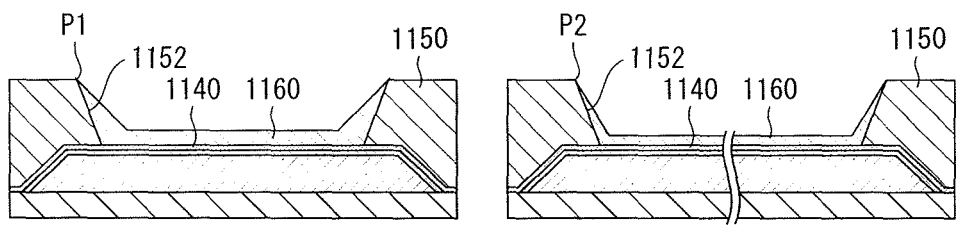

In the conventional method of manufacturing the light-emitting element, as illustrated in FIG. 7A, a reflective electrode 1120, a light-transmissive electrode 1130, and a hole-injection layer 1140 are formed on a substrate 1110 as an underlayer, and a bank 1150 is formed above the substrate 1110. Next, as illustrated in FIG. 7B, energy rays are radiated from above the bank 1150 towards the bank 1150. Next, as illustrated in FIG. 7C, ink 1161 is dropped into an opening provided in the bank 1150. Next, as illustrated in FIG. 7D, the ink 1161 is dried, forming a functional layer.

However, because the central sections 104 of the inclined portion 1155 overlap an upper surface 1121 of the reflective electrode 1120 in plan view, the energy rays are reflected at the upper surface 1121 and, as illustrated in FIG. 7B, the energy rays are transmitted twice through an inclined surface 1152. Thus, a level of reduction in liquid repellency of the inclined surface 1152 due to the energy rays being transmitted therethrough is the same at the central sections 104 and at the end sections 103. Accordingly, as illustrated in FIG. 7C, a degree of contact between the ink 1161 and the inclined surface 1152 is also the same, and, as illustrated in FIG. 7D, a pinning point P1 at the central sections 104 and a pinning point P2 at the end sections 103 are at the same height. Thus, film thickness at the central sections 104 becomes thicker than at the end sections 103, because the inclined surface 1152 has a higher wettability at the central sections 104 and therefore functional material attaches to the inclined surface 1152 more easily at the central sections 104.

Figure 8A:
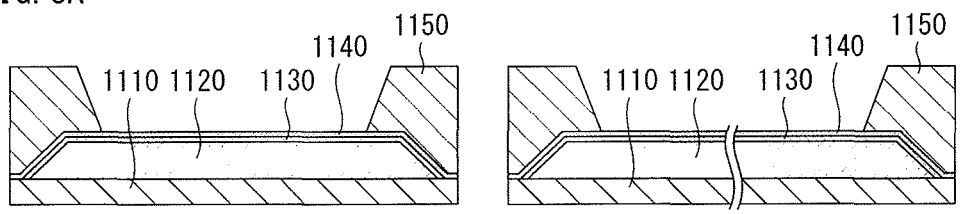
FIGS. 8A to 8C are process diagrams for describing a main part of a method of manufacturing a light-emitting element pertaining to a comparative example 2.
Figure 8B:
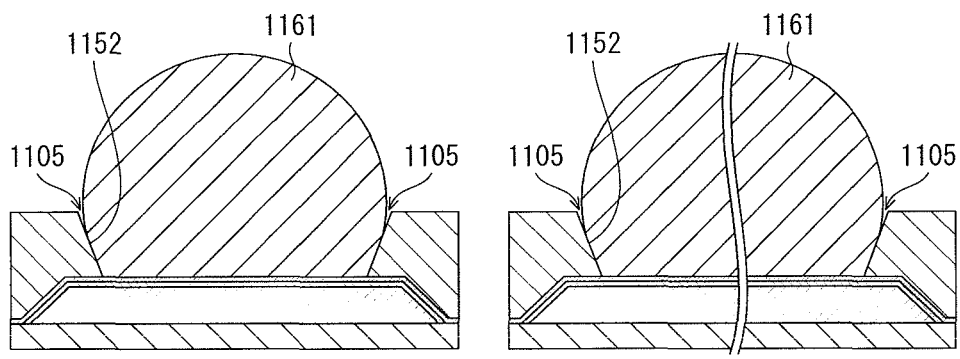
Figure 8C:
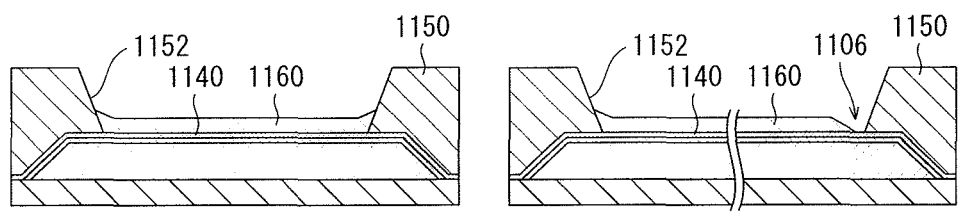

FIGS. 8A to 8C are process diagrams for describing a main part of a method of manufacturing a light-emitting element pertaining to a comparative example 2. In FIGS. 8A to 8C, images on the left side illustrate an end view of a central portion of the light-emitting element and images on the right side illustrate an end view of end portions of the light-emitting element.

Next, a theoretical case in which energy rays are not radiated at all is described. As illustrated in FIG. 8A, the reflective electrode 1120, the light-transmissive electrode 1130, and the hole-injection layer 1140 are formed on the substrate 1110 as the underlayer, and the bank 1150 is formed above the substrate 1110. Next, as illustrated in FIG. 8B, without radiating energy rays, the ink 1161 is dropped into an opening provided in the bank 1150. As illustrated in FIG. 8C, when the ink 1161 is dried to form the light-emitting layer 1160, liquid repellency of the inclined surface 1152 is high at both the central sections 104 and the end sections 103, and therefore not-wet regions 1105 can occur. Thus, at the end sections 103, which have low wettability, a not-wet region 1106 can occur at an upper surface of the hole-injection layer 1140, as illustrated in FIG. 8C.

(Relationship Between Energy Ray Irradiation Amount and Liquid Repellency of Inclined Surface)

The relationship between the energy ray irradiation amount and liquid repellency of the inclined surface was verified by the following experiment. In the experiment, a sample 1 was manufactured according to a method similar to that described above, in which only a reflective electrode and bank was formed on a substrate. Further, a sample 2 was formed having the same structure as that of the sample 1, except that the sample 2 has no reflective electrode.

For each sample, first, ink containing functional material was brought into contact with the bank prior to irradiation by energy rays and a contact angle of the ink was measured. Next, as the energy rays, ultraviolet light having a wavelength of 254 nm was used to irradiate the samples for 180 s, then a baking process was performed on the samples for 15 min at 200° C. Then, as before, for each sample ink was brought into contact with the bank and a contact angle of the ink was measured.

Figure 9:
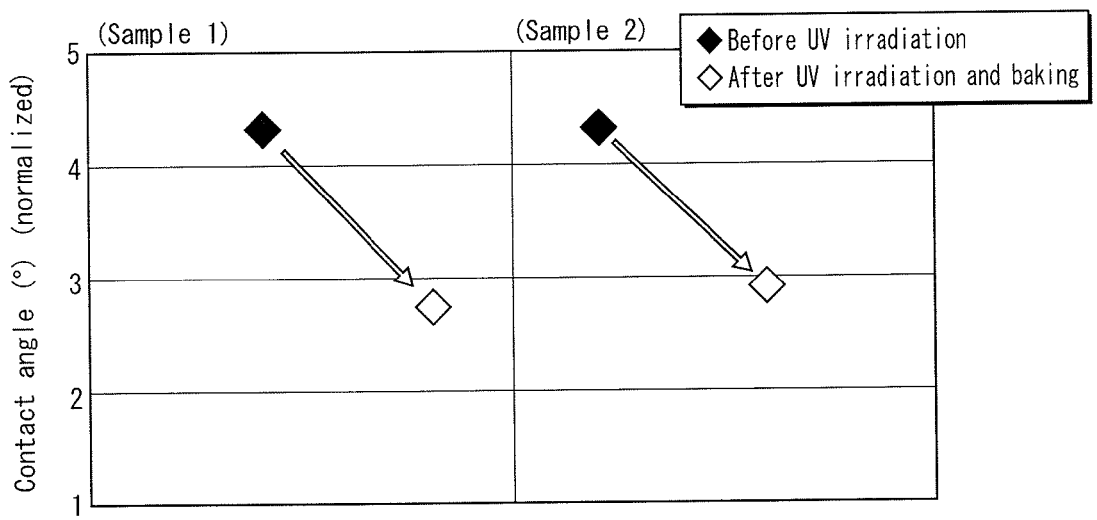
FIG. 9 is a diagram illustrating a relationship between energy ray irradiation and a contact angle of ink.

FIG. 9 is a diagram illustrating the relationship between the energy ray irradiation and the contact angle of the ink. As illustrated in FIG. 9, the contact angle of the ink for both samples became smaller, due to the irradiation of the bank. This may be considered to be due to liquid repellency of the surface of the bank being decreased by the irradiation. Further, because the contact angle of the ink was smaller in sample 1, which had the reflective electrode, it may be considered that a structure which reflects the energy rays more easily reduces liquid repellency of the surface of the bank.

(Relationship Between Liquid Repellency of Inclined Surface and Film Thickness of Functional Layer)

Next, the relationship between liquid repellency of the inclined surface and film thickness of the functional layer was verified. In an experiment, top-emission type light-emitting elements in which a reflective electrode was formed below a bank, and bottom-emission type light-emitting elements in which a reflective electrode was not formed below a bank were manufactured.

Figure 10:
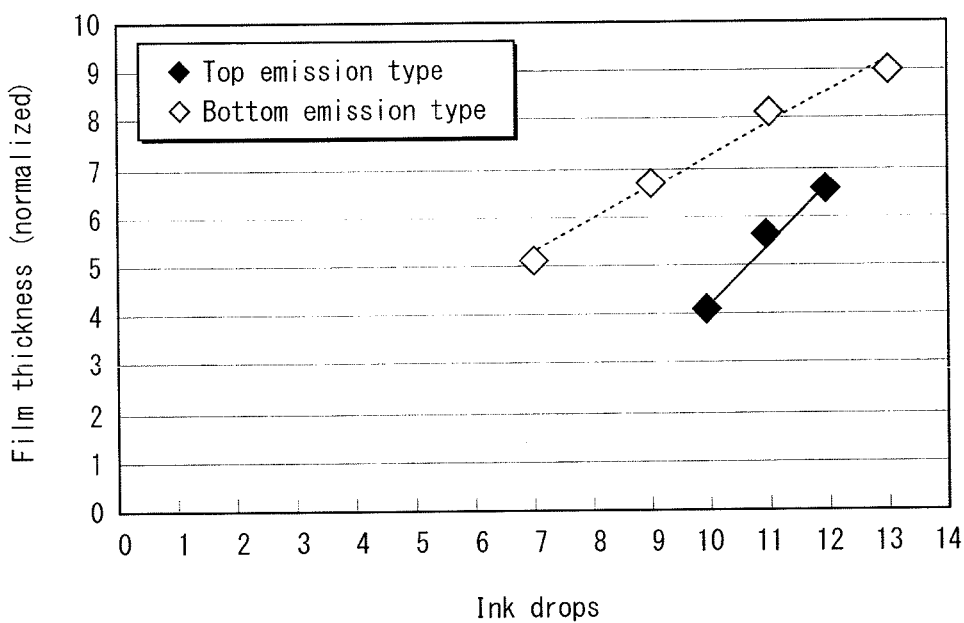
FIG. 10 is a diagram illustrating an effect of presence and absence of a reflective electrode on film thickness of a functional layer.

FIG. 10 is a diagram illustrating an effect of presence and absence of the reflective electrode on film thickness of a functional layer. As illustrated in FIG. 10, when the same number of drops of ink was dropped into the opening, film thickness at a central portion of the functional layer of the top-emission type light-emitting elements was thinner than film thickness at a central portion of the functional layer of the bottom-emission type light-emitting elements.

Because the energy rays were reflected by the reflective electrode in the top-emission type light-emitting elements, liquid repellency of the inclined surface of the bank was low, and an amount of functional material attached to the inclined surface of the bank was high. Thus, it may be considered that film thickness at the central portion of the functional layer was thin because functional material was not insufficient at the central portion of the opening. Because the energy rays were not reflected by the reflective electrode in the bottom-emission type light-emitting elements, liquid repellency of the inclined surface of the bank was high, and an amount of functional material attached to the inclined surface of the bank was low. Thus, it may be considered that film thickness at the central portion of the functional layer was thick because functional material was insufficient at the central portion of the opening. This result confirmed that when liquid repellency of the inclined portion of the bank is high, film thickness of the functional layer near the inclined surface is thin.

<Embodiment 2>

A light-emitting element pertaining to embodiment 2 from the light-emitting element pertaining to embodiment 1 in that, in plan view, central sections of the inclined portion of the bank overlap neither the upper surface nor the side surface of the reflective electrode, whereas in the light-emitting element pertaining to embodiment 1 the central sections of the inclined portion do overlap with the side surface of the reflective electrode. Other points are essentially the same as in the light-emitting element pertaining to embodiment 1. The following is a description of only the points of difference between the light-emitting element pertaining to embodiment 2 and the light-emitting element pertaining to embodiment 1.

Figure 11:
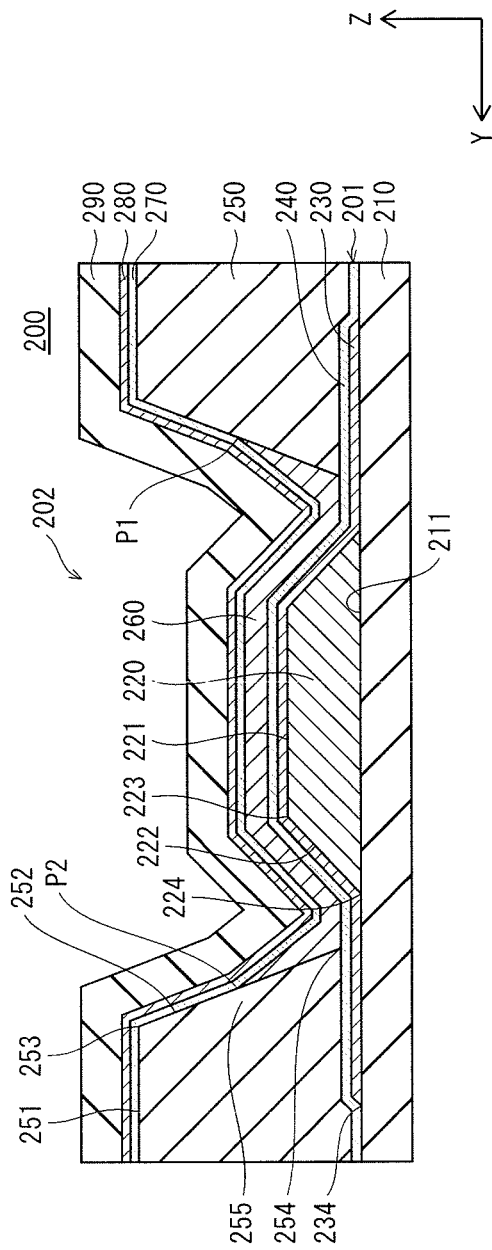
FIG. 11 is an end view illustrating a light-emitting element pertaining to embodiment 2.
Figure 12A:
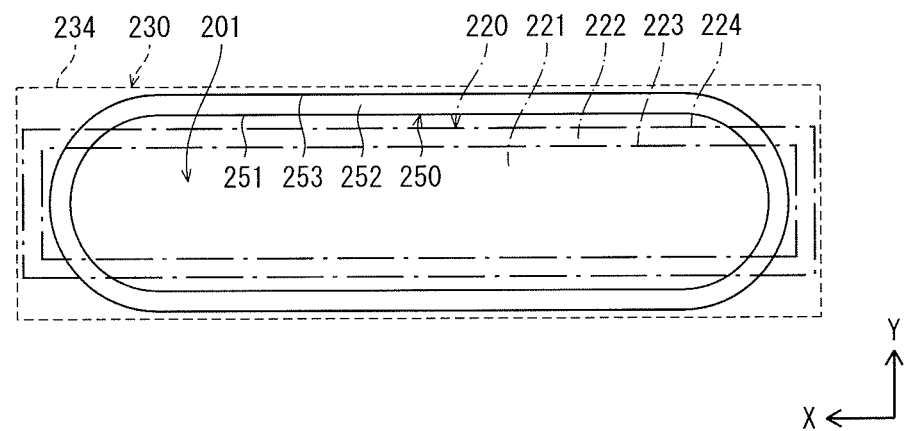
FIGS. 12A and 12B are schematic diagrams illustrating a reflective electrode, light-transmissive electrode, and bank of the light-emitting element pertaining to embodiment 2.
Figure 12B:
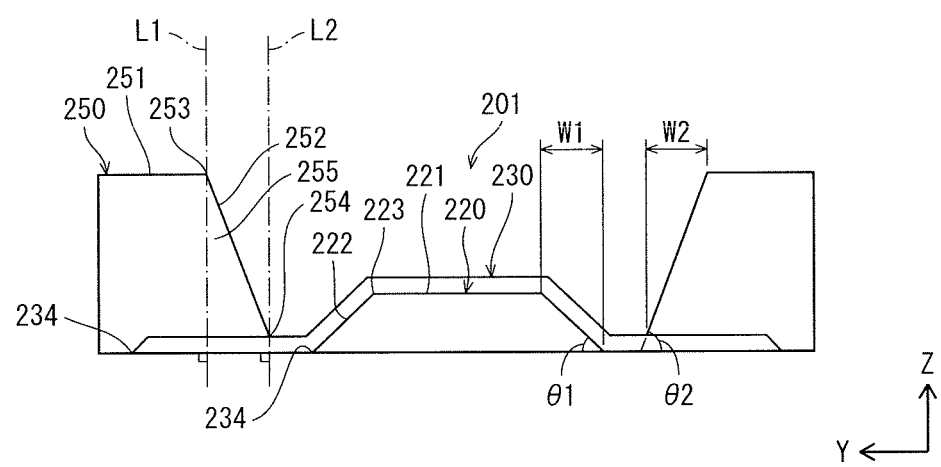

FIG. 11 is an end view illustrating a light-emitting element pertaining to embodiment 2, which is an end view of a cross-section taken along the A-A line in FIG. 2. FIGS. 12A and 12B are schematic views of a reflective electrode, light-transmissive electrode, and bank of the light-emitting element pertaining to embodiment 2. FIG. 12A is a plan view, and FIG. 12B is an end view of a portion along the line A-A in FIG. 2. Note that in FIGS. 12A and 12B, layers other than the reflective electrode, light-transmissive electrode, and bank are omitted.

As illustrated in FIG. 11, a light-emitting element 200 pertaining to the embodiment 2 is a top-emission type organic EL element. A reflective electrode 220, a light-transmissive electrode 230, a hole-injection layer 240, a bank 250, a light-emitting layer 260, an electron injection layer 270, a shared electrode 280, and a sealing layer 290 are layered on a substrate 210. An underlayer 201 is composed of the reflective electrode 220, the light-transmissive electrode 230, and the hole-injection layer 240.

The reflective electrode 220 has an upper surface 221 parallel to an upper surface 211 of the substrate 210 and a side surface 222 that is inclined with respect to the upper surface 211 of the substrate 210. The upper surface 221 and the side surface 222 reflect the energy rays. The side surface 222 has an upper edge 223 that is contiguous with the upper surface 222, and a lower edge 224 that is in contact with the upper surface 211 of the substrate 210.

The bank 250 has an upper surface 251 that is parallel with the upper surface 211 of the substrate 210 and an inclined surface 252 that is inclined with respect to the upper surface 211 of the substrate 210. The upper surface 251 and the inclined surface 252 have liquid repellency. The inclined surface 252 has an annular shape facing an opening 202. An upper edge 253 of the inclined surface 252 is contiguous with the upper surface 251, and a lower edge 254 is in contact with the hole-injection layer 240.

The bank 250 has an inclined portion 255 surrounding the opening 202. The inclined portion 255 is, in a cross-section perpendicular to the upper surface 211 of the substrate 210 (see FIG. 12B), a portion between a boundary L1, which is perpendicular to the upper surface 211 of the substrate 210 and passes through the upper edge 253 of the inclined surface 252, and a boundary L2, which is perpendicular to the upper surface 211 of the substrate 210 and passes through the lower edge 254 of the inclined surface 252.

In plan view (see FIG. 12A), the end sections (portions indicated by signs 103 in FIG. 2) in the direction of the long axis of the inclined portion 255 of the bank 250 overlap the upper surface 221 of the reflective electrode 220, and the central sections (portions indicated by signs 104 in FIG. 2) in the direction of the long axis of the inclined portion 255 of the bank 250 overlap neither the upper surface 221 nor the side surface 222 of the reflective electrode 220. In other words, in plan view, the lower edge 224 of the side surface 222 of the reflective electrode 220 is within the opening 202 and does not contact the inclined surface 252 of the bank 250. Note that, in plan view, there is a gap between the bank 250 and the reflective electrode 220, but as illustrated in FIG. 11, the light-emitting layer 260 is present in the gap. Accordingly, light emitted from the light-emitting layer 260 is also transmitted through the gap and emitted from a lower surface of the substrate 210. In other words, while the light-emitting element 200 is top-emission type, light is also emitted from a bottom side of the light-emitting element 200.

Figure 13A:
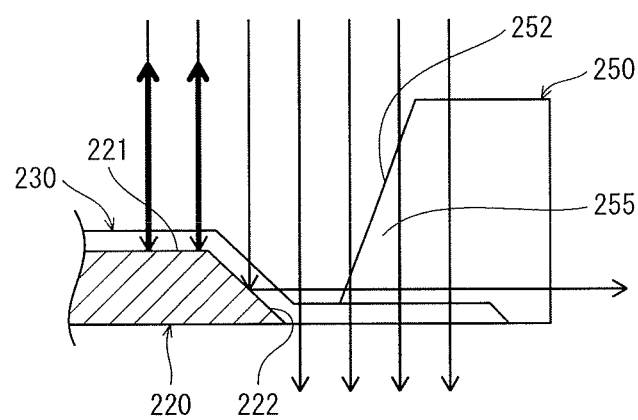
FIGS. 13A and 13B are schematic diagrams illustrating reflection of energy rays at the light-emitting element pertaining to embodiment 2.
Figure 13B:
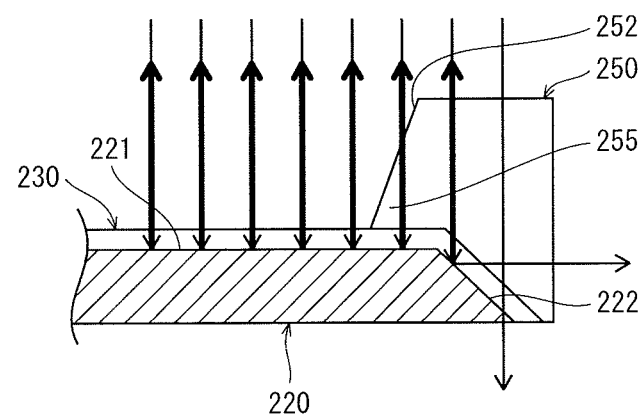

FIGS. 13A and 13B are schematic diagrams illustrating reflection of the energy rays at the light-emitting element pertaining to embodiment 2. FIG. 12A illustrates reflection at the central sections of the inclined portion. FIG. 12B illustrates reflection at the end sections of the inclined portion. Note that in FIGS. 13A and 13B, layers other than the reflective electrode, light-transmissive electrode, and bank are omitted.

As illustrated in FIG. 13A and FIG. 13B, reflection of the energy rays differs at the end sections 103 of the inclined portion 255 and the central sections 104 of the inclined portion 255.

As illustrated in FIG. 13A, at the central sections 104 of the inclined portion 255, the upper surface 221 and the side surface 222 of the reflective electrode 220 are not present at a position corresponding to the inclined portion 255 (directly below the inclined portion 255). Energy rays that are transmitted through the inclined portion 255 are also transmitted through the light-transmissive electrode 230, the substrate 210, etc., and exit from a lower surface of the substrate 210. In such a case, the energy rays pass through the inclined surface 252 of the bank 250 only once.

On the other hand, as illustrated in FIG. 13B, at the end sections 103 of the inclined portion 255, the upper surface 221 of the reflective electrode 220 is present at a position corresponding to the inclined portion 255, and therefore energy rays that are transmitted through the inclined portion 255 and reach the reflective electrode 220 are reflected upwards. Accordingly, reflected energy rays are again transmitted through the entirety of the inclined portion 255. In such a case, the energy rays pass through the inclined surface 252 of the bank 250 twice.

In this way, an irradiation amount due to energy rays incident on the inclined surface 252 differs between the end sections 103 of the inclined portion 255 and the central sections 104 of the inclined portion 255. A greater amount of energy rays irradiate the end sections 103 of the inclined portion 255. Accordingly, the inclined surface 252 has a higher liquid repellency at the central sections 104 than at the end sections 203.

Thus, as illustrated in FIG. 11, a pinning point P1 is low at the central sections 104, where liquid repellency of the inclined surface 252 is high. On the other hand, a pinning point P2 is high at the end sections 103, where liquid repellency of the inclined surface 252 is low, the same way as in the light-emitting element 100 pertaining to embodiment, as illustrated in FIG. 3B. As a result, film thickness of the light-emitting layer 260 at the end sections 103 approximates film thickness of the light-emitting layer 260 at the central sections 104.

In the case of the light-emitting element 200 pertaining to embodiment 2, in plan view, it suffices that the bank 250 does not overlap with the reflective electrode 220. Therefore, by widening the gap between the bank 250 and the reflective electrode 220, even if the position of the opening 202 is somewhat misaligned, the energy rays reflected at the reflective electrode 220 are not transmitted through the central sections 104 of the inclined portion 255. Thus, compared with the light-emitting element 100 pertaining to embodiment 1, for which precise control of positioning of the side surface of the reflective electrode 120 below the central sections 104 of the inclined portion 155 is required, precise control of positioning of the opening 202 is not required.

The light-emitting element 200 pertaining to embodiment 2 can be manufactured by essentially the same method of manufacture as that of the light-emitting element 100 pertaining to embodiment 1. The point of difference from the method of manufacture for the light-emitting element pertaining to embodiment 1 is that, in plan view, a width of the reflective electrode 220 along the short axis is formed so as to be narrower than a width of the reflective electrode 120 pertaining to embodiment 1, in order that the central portions 104 of the inclined portion 255 do not overlap the reflective electrode 220.

<Embodiment 3>

A light-emitting element pertaining to embodiment 3 differs from the light-emitting element pertaining to embodiment 1 in that the side surface of the reflective electrode is perpendicular to the upper surface of the substrate and that, in plan view, the reflective electrode has a substantially H shape, whereas in the light-emitting element pertaining to embodiment 1, the side surface of the reflective electrode is inclined and, in plan view, the reflective electrode has a rectangular shape. Other points are essentially the same as in the light-emitting element pertaining to embodiment 1. The following is a description of only the points of difference between the light-emitting element pertaining to embodiment 3 and the light-emitting element pertaining to embodiment 1.

Figure 14A:
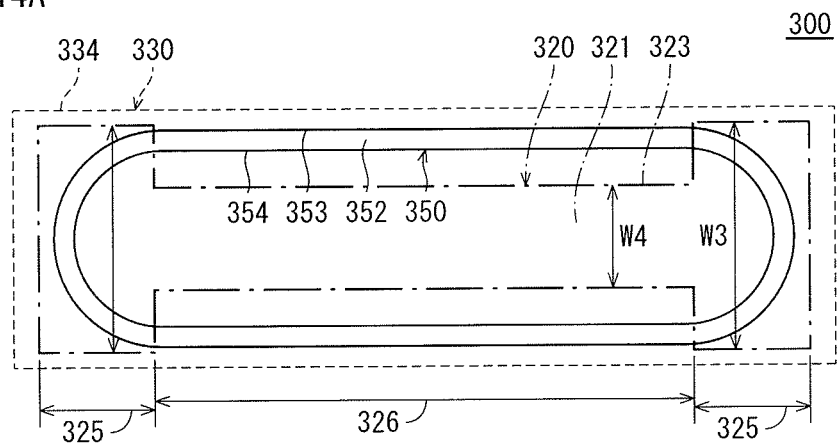
FIGS. 14A to 14C are schematic diagrams illustrating a reflective electrode, light-transmissive electrode, and bank of the light-emitting element pertaining to embodiment 3.
Figure 14B:
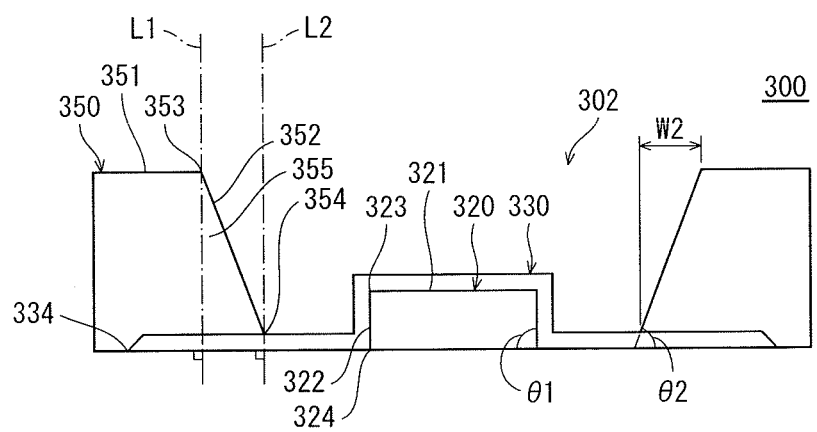
Figure 14C:
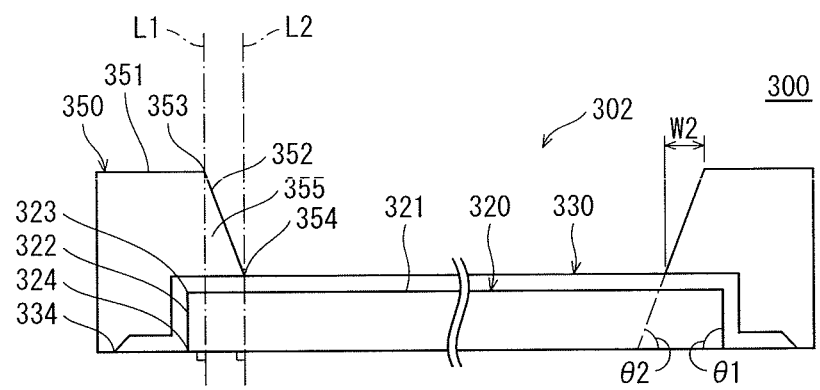

FIGS. 14A-14C are schematic views of a reflective electrode, light-transmissive electrode, and bank of the light-emitting element pertaining to embodiment 3. FIG. 14A is a plan view, FIG. 14B is an end view of a portion along the line A-A in FIG. 2, and FIG. 14C is an end view of a portion along the line B-B in FIG. 2.

As illustrated in FIG. 14B, the light-emitting element pertaining to embodiment 3, like the light-emitting element 100 pertaining to embodiment 1, has a layered structure in which a reflective electrode 320, a light-transmissive electrode 330, a hole-injection layer, a bank 350, a light-emitting layer, an electron injection layer, a shared electrode, and a sealing layer are layered on a substrate. Note that in FIGS. 14A-14C, layers other than the reflective electrode, light-transmissive electrode, and bank are omitted.

The reflective electrode 320 has an upper surface 321 that is parallel with an upper surface of the substrate and a side surface 322 that is substantially perpendicular to the upper surface of the substrate, and reflects energy rays at the upper surface 321. The side surface 322 has an upper edge 323 that is contiguous with the upper surface 321, and a lower edge 324 that is in contact with the upper surface of the substrate.

The bank 350 has an upper surface 351 that is parallel with the upper surface of the substrate and an inclined surface 352 that is inclined with respect to the upper surface of the substrate. Both the upper surface 351 and the inclined surface 352 have liquid repellency. The inclined surface 352 has an annular shape facing an opening 302. An upper edge 353 of the inclined surface 352 is contiguous with the upper surface 351, and a lower edge 354 is in contact with the hole-injection layer.

The bank 350 has an inclined portion 355 surrounding the opening 302. The inclined portion 355 is, in a cross-section perpendicular to the upper surface of the substrate (see FIG. 14B), a portion between a boundary L1, which is perpendicular to the upper surface of the substrate and passes through the upper edge 353 of the inclined surface 352, and a boundary L2, which is perpendicular to the upper surface of the substrate and passes through the lower edge 354 of the inclined surface 352.

In plan view (see FIG. 14A), the end sections (portions indicated by signs 103 in FIG. 2) in the direction of the long axis of the inclined portion 355 of the bank 350 overlap the upper surface 321 of the reflective electrode 320, and the central sections (portions indicated by signs 104 in FIG. 2) in the direction of the long axis of the inclined portion 355 of the bank 350 do not overlap the upper surface 321 of the reflective electrode 320. The side surface 322 of the reflective electrode 320, which is substantially perpendicular to the surface of the substrate, also does not overlap the central sections 104 of the inclined portion 355 in plan view.

Further, a width W3 of a short axis of the opening 302 at opening end sections 325 (portions of the opening 302 corresponding to a lower part thereof, having semicircular arc shapes opposite each other across the short axis of the opening 302) is formed to be as wide as the upper surface 321 of the reflective electrode 320, which is below the inclined portion 355 of the bank 350. A width W4 of a short axis of the opening 302 at a portion 326 other than the opening end sections 325 is formed to be thin enough that a gap occurs between the bank 350 and the reflective electrode 320.

In plan view, the upper edge 323 and the lower edge 324 of the side surface 322 are substantially aligned, are positioned within the opening 302, and do not overlap with the inclined portion 352 of the bank 350. Further, in plan view, there is a gap between the bank 350 and the reflective electrode 320, and the light-emitting layer is present in the gap. Accordingly, light emitted from the light-emitting layer is also transmitted through the gap and emitted from a lower surface of the substrate. In other words, while the light-emitting element 300 is top-emission type, light is also emitted from a bottom side of the light-emitting element 300. Further, because the width W4 is narrow, except for the opening end portions 325, light emission efficiency from the bottom side of the reflective electrode 320 is high.

Because the side surface 322 of the reflective electrode 320 is substantially perpendicular to the upper surface of the substrate, the light-emitting element 300 pertaining to embodiment 3, unlike the light-emitting element 200 pertaining to embodiment 2, has a gap between the bank 350 and the reflective electrode 320 that is wide. This point is also beneficial for efficiency of emission of light from the bottom side.

Figure 15A:
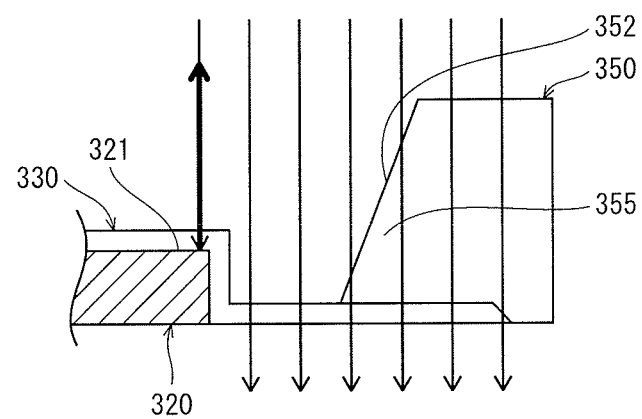
FIGS. 15A and 15B are schematic diagrams illustrating reflection of energy rays at the light-emitting element pertaining to embodiment 3.
Figure 15B:
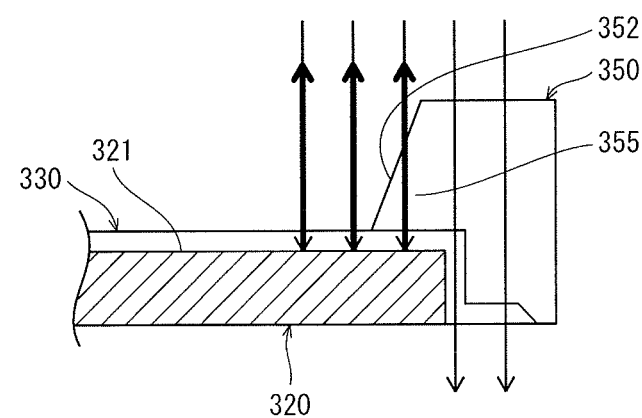

FIGS. 15A and 15B are schematic diagrams illustrating reflection of the energy rays at the light-emitting element pertaining to embodiment 3. FIG. 15A illustrates reflection at the central sections of the inclined portion. FIG. 15B illustrates reflection at the end sections of the inclined portion. Note that in FIGS. 15A and 15B, layers other than the reflective electrode, light-transmissive electrode, and bank are omitted.

As illustrated in FIG. 15A and FIG. 15B, reflection of the energy rays differs at the end sections 103 of the inclined portion 355 and the central sections 104 of the inclined portion 355.

As illustrated in FIG. 15A, at the central sections 104 of the inclined portion 355, neither the side surface 322 nor the upper surface 321 of the reflective electrode 320 are present at a position corresponding to the inclined portion 355 (directly below the inclined portion 355), and therefore energy rays that are transmitted through the inclined portion 355 are further transmitted through the light-transmissive electrode 330, the substrate, etc., and exit at a lower surface side of the substrate. In such a case, the energy rays pass through the inclined surface 352 of the bank 350 only once.

On the other hand, as illustrated in FIG. 15B, at the end sections 103 of the inclined portion 355, the upper surface 321 of the reflective electrode 320 is present at a position corresponding to the inclined portion 355, and therefore energy rays transmitted through the inclined portion 355 that reach the reflective electrode 320 are reflected upwards. Accordingly, reflected energy rays are again transmitted through the entirety of the inclined portion 355. In such a case, the energy rays pass through the inclined surface 352 of the bank 350 twice.

In this way, an irradiation amount due to energy rays incident on the inclined surface 352 and the inclined portion 355 differs between the end sections 103 of the inclined portion 355 and the central sections 104 of the inclined portion 355. The end sections 103 of the inclined portion 355 are irradiated by a greater amount of energy rays. Accordingly, the inclined surface 352 has a higher liquid repellency at the central sections 104 than at the end sections 103.

Accordingly, a pinning point P1 is low at the central sections 104, where liquid repellency of the inclined surface 352 is high, the same way as in the light-emitting element 100 pertaining to embodiment 1, as illustrated in FIG. 3A. On the other hand, a pinning point P2 is high at the end sections 103, where liquid repellency of the inclined surface 352 is low, the same way as in the light-emitting element 100 pertaining to embodiment 1, as illustrated in FIG. 3B. As a result, film thickness of the light-emitting layer at the end sections 103 approximates film thickness of the light-emitting layer at the central sections 104.

In the case of the light-emitting element 300 pertaining to embodiment 3, in the same way as the light-emitting element 200 pertaining to embodiment 2, it suffices that, in plan view, the bank 350 does not overlap with the reflective electrode 320. Therefore, by widening the gap between the bank 350 and the reflective electrode 320, even if the position of the opening 302 is somewhat misaligned, the energy rays reflected at the reflective electrode 320 are not transmitted through the central sections 104 of the inclined portion 355. Thus, compared with the light-emitting element 100 pertaining to embodiment 1, for which precise control of positioning of the side surface 122 of the reflective electrode 120 below the central sections 104 of the inclined portion 155 is required, precise control of positioning of the opening 203 is not required. Further, because, in plan view, the reflective electrode 320 has the substantially H shape, a greater amount of light from the light-emitting layer is emitted from the bottom side of the substrate than in the light-emitting element 200 pertaining to embodiment 2.

The light-emitting element 300 pertaining to embodiment 3 can be manufactured by essentially the same method of manufacture as that of the light-emitting element 100 pertaining to embodiment 1. The method of manufacturing the light-emitting element 300 pertaining to embodiment 3 differs from the method of manufacturing the light-emitting element 100 pertaining to embodiment 1 in that, in plan view, the substantially H-shaped reflective electrode 320 is formed so as to not overlap with the central sections 104 of the inclined portion 355, and such that light from the light-emitting layer is transmitted from a gap between the reflective electrode 320 and the bank 350 to the lower surface of the substrate and emitted therefrom. Further, in forming the reflective electrode 320, the side surface 322 of the reflective electrode 320 is formed to be substantially perpendicular to the upper surface of the substrate by patterning of a metal thin film.

<Supplement>

Specific description has been given of aspects of the present invention including the method of manufacturing the light-emitting element, the light-emitting element, and the display panel, based on embodiments 1-3. However, the present invention is not limited to the above-described embodiments 1-3. For example, in embodiments 1 and 2, the hole-injection layer 140, 240 is described as being below the bank 150, 250, but the present invention is not limited to such a structure. For example, the hole-injection layer may be formed within the opening in the bank by a coating method, like the light-emitting layer.

Furthermore, a method of manufacturing a light-emitting element, a light-emitting element, or a display panel may be an appropriate combination of partial configurations of embodiments 1-3.

INDUSTRIAL APPLICABILITY

The present invention may be used as, for example, a method of manufacturing light-emitting elements used as display elements of a mobile phone display, a television, etc., or used in various light sources.

REFERENCE SIGNS LIST 10 display panel
100, 200, 300 light-emitting element
101, 201 underlayer
102, 202, 302 opening
103 end sections
104 central sections
110, 210 substrate
111, 211 upper surface
120, 220, 320 reflective electrode
121, 221, 321 upper surface
122, 222, 322 side surface
130, 230, 330 light-transmissive electrode
150, 250, 350 bank
155, 255, 355 inclined portion
160, 260 functional layer (light-emitting layer)

The invention claimed is:

1. A method of manufacturing a light-emitting element, comprising:
    forming an underlayer on a substrate, the underlayer including a reflective electrode;
    forming, on the underlayer, a bank having liquid repellency and provided with an opening and an inclined portion surrounding the opening, the opening having a shape that has a long axis and a short axis and being positioned above the reflective electrode;
    radiating energy rays from above the bank towards the bank, the energy rays being transmitted through the bank, being reflected upwards at an upper surface of the reflective electrode, and causing the liquid repellency of the bank to decrease; and
    forming, on the underlayer, a functional layer within the opening, wherein
    in forming the bank, in plan view, end sections of the inclined portion in a direction of the long axis overlap the upper surface of the reflective electrode, while central sections of the inclined portion in the direction of the long axis do not overlap the upper surface of the reflective electrode.

2. The method of claim 1, wherein
    in forming the underlayer, a side surface of the reflective electrode, contiguous with the upper surface of the reflective electrode, is formed to be an inclined surface, and
    in forming the bank, the central sections of the inclined portion are formed so as to overlap, in plan view, the side surface of the reflective electrode.

3. The method of claim 2, wherein
    in forming the underlayer, the side surface of the reflective electrode is formed to have an angle of inclination with respect to an upper surface of the substrate no less than 20° and no greater than 70°.

4. The method of claim 1, wherein
    in forming the bank, the central sections of the inclined portion are formed so as not to overlap, in plan view, the upper surface or a side surface of the reflective electrode, the side surface of the reflective electrode being contiguous with the upper surface of the reflective electrode.

5. The method of claim 4, wherein
    in forming the underlayer, the side surface of the reflective electrode is formed to be substantially perpendicular with respect to an upper surface of the substrate.

6. The method of claim 1, wherein
    in forming the underlayer, a light-transmissive electrode is formed to be located below the opening so as to entirely overlap, in plan view, a lowest end of the shape of the opening.

* * * * *